US009960346B2

(12) United States Patent
Harms et al.

(10) Patent No.: US 9,960,346 B2
(45) Date of Patent: May 1, 2018

(54) MAGNETIC TUNNEL JUNCTIONS (71) Applicant: Micron Technology, Inc., Boise, ID (US)

(72) Inventors: Jonathan D. Harms, White Plains, NY (US); Wei Chen, White Plains, NY (US); Sunil S. Murthy, New York, NY (US); Witold Kula, Gilroy, CA (US)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 14/706,182

(22) Filed: May 7, 2015

(65) Prior Publication Data

US 2016/0329486 A1 Nov. 10, 2016

(51) Int. Cl.
*H01L 43/08* (2006.01)
(52) U.S. Cl.
CPC .................................. *H01L 43/08* (2013.01)
(58) Field of Classification Search
CPC ....................................................... H01L 48/02
USPC ......................................................... 257/721
See application file for complete search history.

(56) References Cited

U.S. PATENT DOCUMENTS

| | | |
|---|---|---|
| 5,640,343 A | 6/1997 | Gallagher et al. |
| 5,898,548 A | 4/1999 | Dill |
| 5,949,600 A | 9/1999 | Akiyama |
| 5,994,899 A | 11/1999 | Mohri |
| 6,034,882 A | 3/2000 | Johnson et al. |
| 6,048,632 A | 4/2000 | Solin |
| 6,538,921 B2 | 3/2003 | Daughton |
| 6,600,184 B1 * | 7/2003 | Gill .................... B82Y 10/00 257/25 |
| 6,603,677 B2 | 8/2003 | Redon et al. |
| 6,788,502 B1 | 9/2004 | Gill |

(Continued)

FOREIGN PATENT DOCUMENTS

| | | |
|---|---|---|
| CN | 1339159 | 3/2002 |
| EP | 11845727.4 | 3/2014 |

(Continued)

OTHER PUBLICATIONS

U.S. Appl. No. 14/228,104, filed Mar. 27, 2014, Micron Technology, Inc.

(Continued)

*Primary Examiner* — Moazzam Hossain
*Assistant Examiner* — Warren H Kilpatrick
(74) *Attorney, Agent, or Firm* — Wells St. John P.S.

(57) ABSTRACT

A magnetic tunnel junction has a conductive first magnetic electrode comprising magnetic recording material. A conductive second magnetic electrode is spaced from the first electrode and comprises magnetic reference material. A non-magnetic tunnel insulator material is between the first and second electrodes. The magnetic recording material of the first electrode comprises a first magnetic region, a second magnetic region spaced from the first magnetic region, and a third magnetic region spaced from the first and second magnetic regions. A first non-magnetic insulator metal oxide-comprising region is between the first and second magnetic regions. A second non-magnetic insulator metal oxide-comprising region is between the second and third magnetic regions. Other embodiments are disclosed.

29 Claims, 6 Drawing Sheets

(56) References Cited

U.S. PATENT DOCUMENTS

| | | |
|---|---|---|
| 6,949,435 B2 | 9/2005 | Hsu et al. |
| 7,009,278 B2 | 3/2006 | Hsu |
| 7,233,024 B2 | 6/2007 | Scheuerlein et al. |
| 7,324,313 B2 | 1/2008 | Childress |
| 7,595,520 B2 | 9/2009 | Horng et al. |
| 7,629,637 B2 | 12/2009 | Kajiyama et al. |
| 7,660,153 B2 | 2/2010 | Yamane et al. |
| 7,755,076 B2 | 7/2010 | Lung |
| 7,944,738 B2 | 5/2011 | Liu et al. |
| 7,981,697 B2 | 7/2011 | Wang |
| 7,983,065 B2 | 7/2011 | Samachisa |
| 8,098,520 B2 | 1/2012 | Seigler et al. |
| 8,102,700 B2 | 1/2012 | Liu et al. |
| 8,124,968 B2 | 2/2012 | Koo et al. |
| 8,218,357 B2 | 7/2012 | Liu et al. |
| 8,310,861 B2 | 11/2012 | Liu et al. |
| 8,338,224 B2 | 12/2012 | Yoon et al. |
| 8,431,458 B2 | 4/2013 | Sills et al. |
| 8,482,966 B2 | 7/2013 | Kang et al. |
| 8,536,556 B2 | 9/2013 | Fukumizu |
| 8,553,450 B2 | 10/2013 | Keiji et al. |
| 8,559,141 B1 | 10/2013 | Pakala |
| 8,609,439 B2 | 12/2013 | Prejbeanu et al. |
| 8,836,056 B2 | 9/2014 | Oguz et al. |
| 8,842,465 B2 | 9/2014 | Yamane et al. |
| 9,099,124 B1 | 8/2015 | Freitag |
| 9,177,573 B1 | 11/2015 | Oh |
| 2002/0018355 A1 | 2/2002 | Johnson et al. |
| 2002/0079524 A1 | 6/2002 | Dennison |
| 2002/0153580 A1 | 10/2002 | Hosotani et al. |
| 2003/0206379 A1 | 11/2003 | Lin |
| 2004/0057295 A1 | 3/2004 | Matsukawa et al. |
| 2004/0179395 A1 | 9/2004 | Tsang |
| 2005/0006682 A1 | 1/2005 | Bae et al. |
| 2005/0174835 A1 | 8/2005 | Rinerson et al. |
| 2005/0247964 A1 | 11/2005 | Pietambaram et al. |
| 2005/0254289 A1 | 11/2005 | Nakajima et al. |
| 2006/0017081 A1 | 1/2006 | Sun et al. |
| 2006/0097298 A1 | 5/2006 | Ho |
| 2007/0064350 A1 | 3/2007 | Gill |
| 2007/0064352 A1 | 3/2007 | Gill |
| 2007/0096229 A1* | 5/2007 | Yoshikawa ............. G11C 11/16 257/421 |
| 2007/0217075 A1 | 9/2007 | Kamata |
| 2007/0243638 A1 | 10/2007 | Horng et al. |
| 2008/0144234 A1 | 6/2008 | Lin |
| 2008/0164548 A1 | 7/2008 | Ranjan |
| 2008/0182015 A1 | 7/2008 | Parkin |
| 2008/0191295 A1 | 8/2008 | Ranjan |
| 2009/0046397 A1 | 2/2009 | Sun et al. |
| 2009/0161422 A1 | 6/2009 | Zhu |
| 2009/0218645 A1 | 9/2009 | Ranjan |
| 2009/0261314 A1 | 10/2009 | Kim et al. |
| 2009/0261343 A1 | 10/2009 | Herner et al. |
| 2009/0323385 A1 | 12/2009 | Scheuerlein et al. |
| 2010/0006960 A1 | 1/2010 | Horng et al. |
| 2010/0080894 A1 | 4/2010 | Tsunekawa |
| 2010/0135061 A1 | 6/2010 | Li et al. |
| 2010/0157657 A1 | 6/2010 | Rinerson et al. |
| 2010/0259962 A1 | 10/2010 | Yan et al. |
| 2011/0062538 A1 | 3/2011 | Rizzo et al. |
| 2011/0149646 A1 | 6/2011 | Liu et al. |
| 2011/0232079 A1 | 9/2011 | Miyauchi et al. |
| 2011/0309322 A1 | 12/2011 | Hwang |
| 2011/0318848 A1 | 12/2011 | Choi |
| 2012/0056285 A1 | 3/2012 | Bessho et al. |
| 2012/0068139 A1 | 3/2012 | Daibou |
| 2012/0087179 A1 | 4/2012 | Jung |
| 2012/0127603 A1 | 5/2012 | Gao |
| 2012/0193216 A1 | 8/2012 | Endo |
| 2012/0241879 A1 | 9/2012 | Ikeno et al. |
| 2012/0286382 A1 | 11/2012 | Jan et al. |
| 2013/0004796 A1 | 1/2013 | Peng et al. |
| 2013/0037862 A1 | 2/2013 | Kitagawa et al. |
| 2013/0069184 A1 | 3/2013 | Aikawa |
| 2013/0071954 A1 | 3/2013 | Zhou |
| 2013/0148418 A1 | 6/2013 | Luo et al. |
| 2013/0177781 A1 | 7/2013 | Chepulskyy et al. |
| 2013/0181305 A1 | 7/2013 | Nakayama et al. |
| 2013/0187247 A1 | 7/2013 | Wu et al. |
| 2013/0187248 A1 | 7/2013 | Kariyada |
| 2013/0224521 A1 | 8/2013 | Wang et al. |
| 2013/0236639 A1 | 9/2013 | Carey |
| 2013/0241015 A1 | 9/2013 | Akiko |
| 2013/0244344 A1 | 9/2013 | Malmhall |
| 2013/0307097 A1 | 11/2013 | Yi et al. |
| 2014/0001586 A1 | 1/2014 | Shen et al. |
| 2014/0027869 A1 | 1/2014 | Lee et al. |
| 2014/0038314 A1 | 2/2014 | Zhou |
| 2014/0084401 A1 | 3/2014 | Kato |
| 2014/0117477 A1 | 5/2014 | Park et al. |
| 2014/0131649 A1 | 5/2014 | Daibou et al. |
| 2014/0145792 A1 | 5/2014 | Wang et al. |
| 2014/0175581 A1 | 6/2014 | Guo |
| 2014/0203383 A1 | 7/2014 | Guo |
| 2014/0248719 A1 | 9/2014 | Zhou et al. |
| 2014/0269033 A1 | 9/2014 | Natori et al. |
| 2014/0284742 A1 | 9/2014 | Sawada et al. |
| 2014/0287537 A1 | 9/2014 | Shukh |
| 2015/0069562 A1 | 3/2015 | Sandhu |
| 2015/0076633 A1 | 3/2015 | Siddik et al. |
| 2015/0102439 A1 | 4/2015 | Gan et al. |
| 2015/0137289 A1 | 5/2015 | Khalili-Amiri |
| 2015/0280113 A1 | 10/2015 | Tan |
| 2015/0295164 A1 | 10/2015 | Sandhu et al. |
| 2016/0020250 A1 | 1/2016 | Li et al. |
| 2016/0099035 A1 | 4/2016 | Amiri et al. |
| 2016/0105176 A1 | 4/2016 | Miura |
| 2016/0254445 A1 | 9/2016 | Tahmasebi |
| 2017/0200887 A1 | 7/2017 | Siddik |

FOREIGN PATENT DOCUMENTS

| | | |
|---|---|---|
| EP | 1484347.7 | 3/2017 |
| JP | 2008-034857 | 2/2008 |
| JP | 2009-267411 | 11/2009 |
| JP | 2010-010688 | 1/2010 |
| JP | 2010-034153 | 2/2010 |
| JP | 2010-232214 | 10/2010 |
| JP | 2010-263211 | 11/2010 |
| JP | 2012-519957 | 8/2012 |
| JP | 2012-204432 | 10/2012 |
| JP | 2012-523647 | 10/2012 |
| JP | 2013-140891 | 7/2013 |
| KR | 10-2008-0084590 | 9/2008 |
| KR | 2010-0083402 | 7/2010 |
| KR | 10-2015-0031311 | 3/2015 |
| WO | WO 2010/101340 | 9/2010 |
| WO | PCT/US2011/059095 | 5/2012 |
| WO | PCT/US2011/059095 | 6/2013 |
| WO | PCT/US2014/047572 | 10/2014 |
| WO | PCT/US2015/061568 | 2/2016 |
| WO | PCT/US2014/047572 | 3/2016 |
| WO | PCT/US2016/018045 | 5/2016 |
| WO | PCT/US2016/018015 | 6/2016 |
| WO | PCT/US2016/018077 | 6/2016 |
| WO | PCT/US2016/014259 | 7/2016 |
| WO | PCT/US2016/24219 | 7/2016 |
| WO | PCT/US17/020734 | 5/2017 |
| WO | PCT/US2015/061568 | 6/2017 |
| WO | PCT/US/16/014259 | 11/2017 |
| WO | PCT/US16/024219 | 11/2017 |

OTHER PUBLICATIONS

U.S. Appl. No. 14/684,110, filed Apr. 10, 2015, Sandhu.
U.S. Appl. No. 14/687,280, filed Apr. 15, 2015, Siddik et al.
U.S. Appl. No. 14/687,317, filed Apr. 15, 2015, Siddik.
U.S. Appl. No. 14/690,803, filed Apr. 20, 2015, Hineman.
U.S. Appl. No. 14/704,023, filed May 5, 2015, Siddik.
Bai et al.; Boron diffusion induced symmetry reduction and scattering in CoFeB/MgO/CoFeB magnetic tunnel junctions; Physical Review B 87; Jan. 23, 2013; pp. 014114-1-014114-6.

(56) References Cited

OTHER PUBLICATIONS

Banderia et al.; Comparison of Synthetic Antiferromagnets and Hard Ferromagnets as Reference Layer in Magnetic Tunnel Junctions With Perpendicular Magnetic Anisotropy; IEEE Magnetics Letters, vol. 1; Jul. 8, 2010; 4 pp.
Bouchikhaoui et al.; On the role of Ta cap in the recrystallization process of CoFeB layers; Applied Physics Letters 103; Oct. 3, 2013; pp. 14212-1-14212-5.
Brataas et al.; Spin Pumping and Spin Transfer; Condensed Matter > Mesoscale and Nanoscale Physics; Cornell University; Mar. 6, 2012; pp. 1-30.
Burton et al.; Atomic and Electronic Structure of the Co Fe B MgO Interface From First Principles; Applied Physics Letters 89; Oct. 5, 2006; pp. 142507-1-142507-3.
Butler et al.; Spin-dependent tunneling conductance of Fe/MgO/Fe sandwiches; Physical Review B, vol. 63; Jan. 8, 2000; pp. 054416-1-054416-12.
Conca et al.; Annealing influence on the Gilbert damping parameter and the exchange constant of CoFeB thin films; Applied Physics Letters 104; May 8, 2014; pp. 182407-1-182407-4.
Devolder et al.; Damping of CoxFe80—xB20 ultrathin films with perpendicular magnetic anisotropy; Applied Physics Letters 102; Jan. 15, 2013; pp. 022407-1-022407-4.
Feng et al.; Annealing of CoFeB/MgO Based Single and Double Barrier Magnetic Tunnel Junctions: Tunnel Magnetoresistance, Bias Dependence, and Output Voltage; Journal of Applied Physics 105; Feb. 11, 2009; pp. 033916-1-033916-7.
Hopp et al.; Chemical Composition and Iron Oxidation State of the Amorphous Silicate Matrix in Acfer 094; 46th Lunar and Planetary Science Conferenrce; Jan. 27, 2015; 2 pp.
Jang et al.; Variation in the properties of the interface in a CoFeB/MgO/CoFeB tunnel junction during thermal anealing; Applied Physics Letters 91; Sep. 4, 2007; pp. 102104-1-102104-3.
Jiang et al.; Sputtered FeCoN soft magnetic thin films with high resistivity; IEEE Transactions on Magnetics, vol. 39, No. 6; Nov. 2003; pp. 3559-3562.
Kuo et al.; Microstructure and magnetic properties of FeCoN thin films; Journal of Applied Physics vol. 83, No. 11; Jun. 1, 1998; pp. 6643-6645.
Kurt et al.; Boron diffusion in magnetic tunnel junctions with MgO (001) barriers and CoFeB electrodes; Applied Physics Letters 96; Jun. 28, 2010; pp. 262501-1-262501-3.
Liu et al.; Ferromagnetic resonance and damping properties of CoFeB thin films as free layers in MgO-based magnetic tunnel junctions; Journal of Applied Physics 110; Aug. 8, 2011; pp. 033910-1-033910-5.
Mathon et al.; Theory of tunneling magnetoresistance of an epitaxial FeO/MgO/Fe(?001)? junction; Physical Review B, vol. 63; May 10, 2001; pp. 220403-1-220403-4.
Mizunuma et al.; MgO barrier-perpendicular magnetic tunnel junctions with CoFe/Pd multilayers and ferromagnetic insertion layers; Applied Physics Letters; Dec. 11, 2009; 17 pp.
Munira et al.; Comparative material issues for fast reliable switching in STT-RAMs; 2011 11th IEEE International Conference on Nanotechnology; Aug. 15-18, 2011; pp. 1403-1408.
Parkin et al.; Giant tunnelling magnetoresistance at room temperature with MgO (100) tunnel barriers; Nature Materials, vol. 3; Dec. 31, 2004; pp. 862-867.
Rickert et al.; Exchange coupling of bilayers and synthetic antiferromagnets pinned to MnPt; The European Physics Journal B; Jan. 8, 2005; pp. 1-6.
Rumaiz et al.; Boron migration due to annealing in CoFeB/MgO/CoFeB interfaces: A combined hard x-ray photoelectron spectroscopy and x-ray absorption studies; Applied Physics Letters 99; Nov. 28, 2011; pp. 222502-1-222502-3.
Sun et al.; Effect of Subvolume Excitation and Spin-Torque Efficiency on Magnetic Switching; Physical Review B-84; Aug. 19, 2011; pp. 064413-1-064413-9.
Tsunoda et al.; A Novel MTJ for STT-MRAM With a Dummy Free Layer and Dual Tunnel Junctions; Electron Device Meeting; Dec. 10-13, 2012; pp. 29.1.1-29.1.4.
You et al.; Boron segregation in crystallized MgO/amorphous-Co40Fe40B20 thin films; Journal of Applied Physics 104; Aug. 5, 2008; pp. 033517-1-033517-6.
Zhang et al.; Large magnetoresistance in bcc Co/MgO/Co and FeCo/MgO/FeCo tunnel junctions; Physical Review B 70; Nov. 17, 2004; pp. 172407-1-172407-4.
U.S. Appl. No. 14/563,303, filed Dec. 8, 2014, Chen et al.
Annealing influence on the Gilbert damping parameter and the exchange constant of CoFeB thin films; Conca et al.; Applied Physics Letter 104; May 8, 2014; pp. 182407-1-182401-4.
Annealing of CoFeB/MgO based single and double barrier magnetic tunnel junctions: Tunnel magnetoresistance, bias dependence, and output voltage; Feng et al; Journal of Applied Physics, vol. 105, Feb. 11, 2009; pp. 033916-1 to 033916-7.
Atomic and Electronic Structure of CoFeB/MgO Interface from First Principles; Burton et al.; Applied Physics Letters, vol. 89; Oct. 5, 2006; pp. 142507-1 to 142507-3.
Boron diffusion in magnetic tunnel junctions with MgO (001) barriers and CoFeB electrodes; Kurt et al.; Applied Physics Letters, vol. 96; Jun. 28, 2010; pp. 262501-1 to 262501-3.
Boron diffusion induced symmetry reduction and scattering in CoFeB/MgO/CoFeB magnetic tunnel junctions; Bai et al.; The American Physical Society; Physical Review B, vol. 87; Jan. 23, 2013; pp. 014114-1 to 014114-6.
Boron migration due to annealing in CoFeB/MgO/CoFeB interfaces: A combined hard x-ray photoelectron spectroscopy and x-ray absorption studies; Rumaiz et al.; Applied Physics Letters, vol. 99; Nov. 28, 2011; pp. 222502-1 to 222502-3.
Boron segregation in crystallized MgO/amorphous-Co 40 Fe 40 B 20 Co 40 Fe 40 B 20 Co 40 Fe 40 B 20 thin films; You et al.; Journal of Applied Physics, vol. 104, Aug. 5, 2008; pp. 033517-1 to 033517-6.
Comparative material issues for fast reliable switching in STT-RAMs; Munira et al.; 2011 11th IEEE International Conference on Nanotechnology; Aug. 15-18, 2012; pp. 1403-1408.
Comparison of Synthetic Antiferromagnets and Hard Ferromagnets as Reference Layer in Magnetic Tunnel Junctions With Perpendicular Magnetic Anisotropy; Bandiera et al.; Spin Electronics; IEE Magnetics Letters, vol. 1; Jul. 8, 2010; 4 pp.
Damping of CoxFe80—xB20 ultrathin films with perendicular magnetic anisotropy; Devolder et al.; Applied Physics Letters 102; Jan. 15, 2013; pp. 022407-1-022407-4.
Exchange coupling of bilayers and synthetic antiferromagnets pinned to MnPt; Rickart et al.; The European Physical Journal B; Mar. 8, 2005; pp. 1-6.
Giant tunnelling magnetoresistance at room temperature with MgO (100) tunnel barriers; Parkin et al.; nature materials, vol. 3; Oct. 31, 2004; pp. 862-867.
Magnetic Tunnel Junctions; Zhu et al.; Materialstoday; vol. 9, No. 11; Nov. 2006; pp. 36-45.
Magnetoresistive Random-Access Memory; www.wikipedia.org/wiki/RAM; As downloaded from the Internet Jul. 28, 2013; 10 pp.
MgO barrier-perpendicular magnetic tunnel junctions with CoFe/Pd multilayers and ferromagnetic insertion layers; Mizunuma et al.; Laboratory for Nanoelectronics and Spintronics, Research Institute of Electrical Communication, Tohoku University; Advanced Research Laboratory, Hitachi, Ltd.; Dec. 11, 2009; 17 pp.
Microstructure and magnetic properties of FeCoN thin films; Kuo et al.; Journal of Applied Physics, vol. 83, No. 11; Jun. 1, 1998; pp. 6643-6645.
On the role of Ta cap in the recrystallization process of CoFeB layers; Bouchikhaoui et al.; Applied Physics Letters, vol. 103; Oct. 3, 2013; pp. 142412-1 to 142412-5.
Spin Pumping and Spin Transfer; Brataas et al.; arXiv:1108.0385v3[cond-ma.tmes-hall]; Mar. 6, 2012; pp. 1-30.
Spin-dependent tunneling conductance of FezMgOzFe sandwiches; Butler et al.; The American Physical Society; Physical Review B, vol. 63; Jan. 8, 2001; pp. 054416-1 to 054416-12.

(56) References Cited

OTHER PUBLICATIONS

Spin-Transfer Torque; www.wikipedia.org/wiki/Spin-transfer_torque; As downloaded from the Internet Aug. 2, 2013; 2 pp.
Sputtered FeCoN Soft Magnetic Thin Films With High Resistivity; Jiang et al.; IEEE Transactions on Magnetics, vol. 39, No. 6; Nov. 2003; pp. 3559-3562.
Status and Challenges for Non-Volatile Spin-Transfer Torque RAM (STT-RAM); Krounbi et al.; International Symposium on Advanced Gate Stack-Technology; Sep. 23, 2010; 28 pp.
Theory of tunneling magnetoresistance of an epitaxial FeÖMgOÖFe/001 junction; Manthan et al.; The American Physical Society; Physical Review B, vol. 63; May 10, 2001; pp. 220403-1 to 220403-4.
Tunnel Magnetoresistance; www.wikipedia.org/wiki/tunnel_manetoresistance; As downloaded from the Internet Jul. 28, 2013; 5 pp.
Variation in the properties of the interface in a CoFeB/MgO/CoFeB tunnel junction during thermal annealing; Jang et al.; Applied Physics Letters, vol. 91; Sep. 4, 2007; pp. 102104-1 to 102104-3.
Zhang et al.; Large magnetoresistance in bcc Co/MgO/Co and FeCo/MgO/FeCo tunnel junctions; The American Physical Society; Physical Review B, vol. 70; Nov. 17, 2004; pp. 172407-1 to 172407-4.
U.S. Appl. No. 14/746,421, filed Jun. 22, 2015, Chen et al.
U.S. Appl. No. 15/154,033, filed May 13, 2016, Chen et al.
Marakov, A.; Chapter 4: Magnetoresistive Memory; Dissertation—Modeling of Emerging Resistive Switching Based Memory Cells; Apr. 4, 1985; 11 pp.
Sbiaa et al.; Materials with perpendicular magnetic anisotropy for magnetic random access memory; Phys. Status Solidi RRL 5, No. 12; 2011; pp. 413-419.

\* cited by examiner

MAGNETIC TUNNEL JUNCTIONS

TECHNICAL FIELD

Embodiments disclosed herein pertain to magnetic tunnel junctions, to methods of forming a magnetic electrode of a magnetic tunnel junction, and to methods of forming a magnetic tunnel junction.

BACKGROUND

A magnetic tunnel junction is an integrated circuit component having two conductive magnetic electrodes separated by a thin non-magnetic tunnel insulator material (e.g., dielectric material). The insulator material is sufficiently thin such that electrons can tunnel from one magnetic electrode to the other through the insulator material under appropriate conditions. At least one of the magnetic electrodes can have its overall magnetization direction switched between two states at a normal operating write or erase current/voltage, and is commonly referred to as the "free" or "recording" electrode. The other magnetic electrode is commonly referred to as the "reference", "fixed", or "pinned" electrode, and whose overall magnetization direction will not switch upon application of the normal operating write or erase current/voltage. The reference electrode and the recording electrode are electrically coupled to respective conductive nodes. Electrical resistance between those two nodes through the reference electrode, insulator material, and the recording electrode is dependent upon the magnetization direction of the recording electrode relative to that of the reference electrode. Accordingly, a magnetic tunnel junction can be programmed into one of at least two states, and those states can be sensed by measuring current flow through the magnetic tunnel junction. Since magnetic tunnel junctions can be "programmed" between two current-conducting states, they have been proposed for use in memory integrated circuitry. Additionally, magnetic tunnel junctions may be used in logic or other circuitry apart from or in addition to memory.

The overall magnetization direction of the recording electrode can be switched by a current-induced external magnetic field or by using a spin-polarized current to result in a spin-transfer torque (STT) effect. Charge carriers (such as electrons) have a property known as "spin" which is a small quantity of angular momentum intrinsic to the carrier. An electric current is generally unpolarized (having about 50% "spin-up" and about 50% "spin-down" electrons). A spin-polarized current is one with significantly more electrons of either spin. By passing a current through certain magnetic material (sometimes also referred to as polarizer material), one can produce a spin-polarized current. If a spin-polarized current is directed into a magnetic material, spin angular momentum can be transferred to that material, thereby affecting its magnetization orientation. This can be used to excite oscillations or even flip (i.e., switch) the orientation/domain direction of the magnetic material if the spin-polarized current is of sufficient magnitude.

An alloy or other mixture of Co and Fe is one common material proposed for use as a polarizer material and/or as at least part of the magnetic recording material of a recording electrode in a magnetic tunnel junction. A more specific example is $Co_xFe_yB_z$ where x and y are each 10-80 and z is 0-50, and may be abbreviated as CoFe or CoFeB. MgO is an ideal material for the non-magnetic tunnel insulator. Ideally such materials are each crystalline having a body-centered-cubic (bcc) 001 lattice. Such materials may be deposited using any suitable technique, for example by physical vapor deposition. One technique usable to ultimately produce the bcc 001 lattice in such materials includes initially forming CoFe to be amorphous and upon which MgO-comprising tunnel insulator material is deposited. During and/or after the depositing, the MgO tunnel insulator, the CoFe, and the tunnel insulator ideally individually achieve a uniform bcc 001 lattice structure.

Boron is commonly deposited as part of the CoFe to assure or provide initial amorphous deposition of the CoFe. Crystallization of the CoFe can occur during or after deposition of the MgO by annealing the substrate at a temperature of at least about 250° C. This will induce the diffusion of B atoms out of the CoFe matrix being formed to allow crystallization into bcc 001 CoFe. Bcc 001 MgO acts as a template during the crystallization of CoFe. However, B in the finished magnetic tunnel junction construction, specifically at the CoFe/MgO interface or inside the MgO lattice, undesirably reduces tunneling magnetoresistance (TMR) of the magnetic tunnel junction.

DETAILED DESCRIPTION OF EXAMPLE EMBODIMENTS

Embodiments of the invention encompass magnetic tunnel junctions. Example embodiments are initially described with reference to FIG. 1 with respect to a substrate fragment 10, and which may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate fragment 10 comprises a base or substrate 11 showing various materials having been formed as an elevational stack there-over. Materials may be aside, elevationally inward, or elevationally outward of the FIG. 1-depicted materials. For example, other partially or wholly fabricated components of integrated circuitry may be provided somewhere about or within fragment 10. Substrate 11 may comprise any one or more of conductive (i.e., electrically herein), semiconductive, or insulative/insulator (i.e., electrically herein) materials. Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Figure 1:
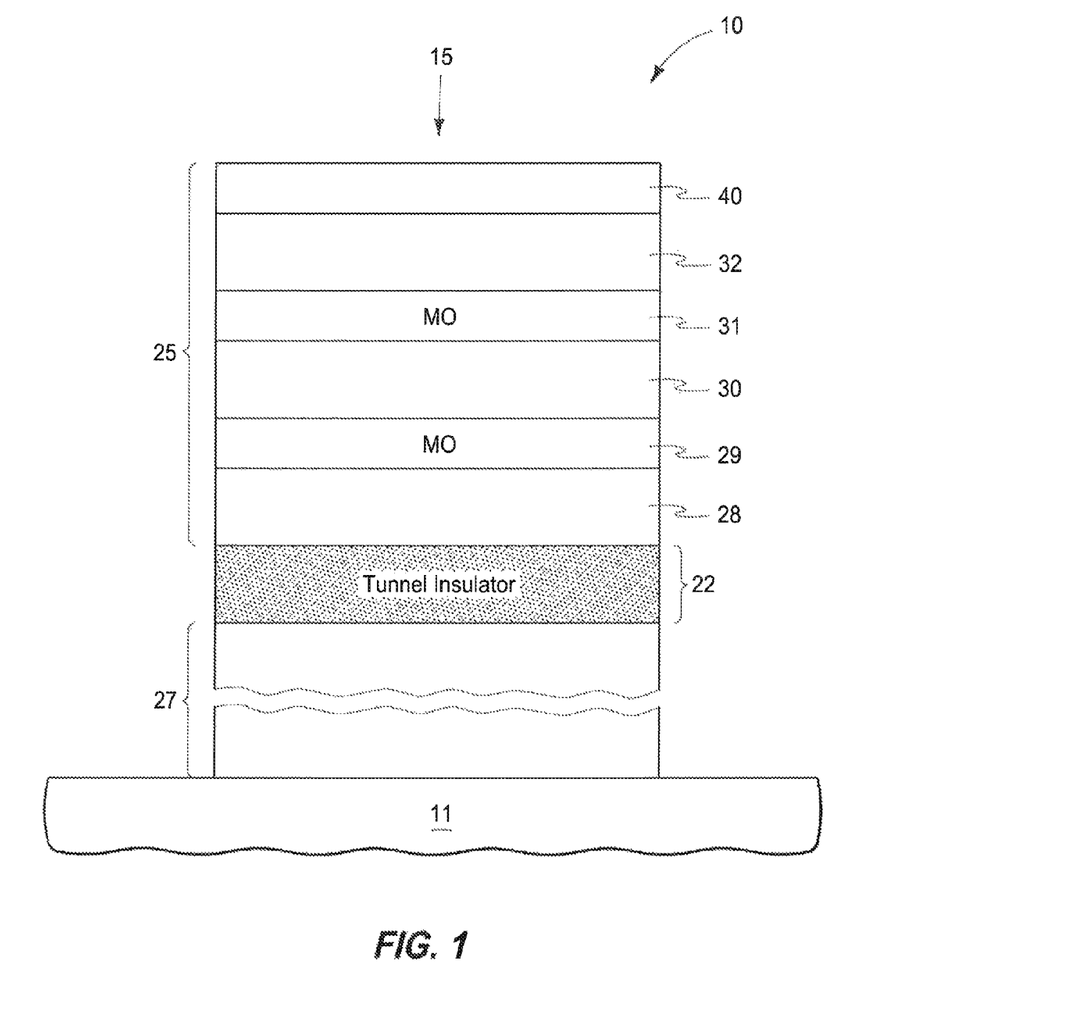
FIG. 1 is a diagrammatic sectional view of a substrate fragment comprising a magnetic tunnel junction in accordance with an embodiment of the invention.

A magnetic tunnel junction 15 is over substrate 11, and comprises a conductive first magnetic (i.e., ferrimagnetic or ferromagnetic herein) electrode 25 comprising magnetic recording material and a conductive second magnetic electrode 27 spaced from first electrode 25 and comprising magnetic reference material. A non-magnetic tunnel insulator material 22 (e.g., comprising, consisting essentially of, or consisting of MgO) is between the first and second electrodes. Electrodes 25 and 27 individually may contain non-magnetic insulator, semiconductive, and/or conductive material or regions. However, electrodes 25 and 27 when considered individually are characterized as being overall and collectively magnetic and conductive even though the electrode may have one or more regions therein that are intrinsically locally non-magnetic and/or non-conductive. Further, reference to "magnetic" herein does not require a stated magnetic material or region to be magnetic as initially formed, but does require some portion of the stated magnetic material or region to be functionally "magnetic" in a finished circuit construction of the magnetic tunnel junction.

Example thickness for each of components 25 and 27 is about 20 Angstroms to about 150 Angstroms, and for component 22 about 5 Angstroms to about 25 Angstroms. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials and regions described herein may be of substantially constant thickness or of variable thicknesses. If of variable thickness, thickness refers to average thickness unless otherwise indicated. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", and "against" not preceded by "directly" encompass "directly against" as well as construction where intervening material(s), region(s), or structure(s) result(s) in no physical touching contact of the stated materials, regions, or structures relative one another.

The elevational positions of electrodes 25 and 27 may be reversed and/or an orientation other than an elevational stack may be used (e.g., lateral; diagonal; a combination of one or more of elevational, horizontal, diagonal; etc.). In this document, "elevational", "upper", "lower", "top", and "bottom" are with reference to the vertical direction. "Horizontal" refers to a general direction along a primary surface relative to which the substrate is processed during fabrication, and vertical is a direction generally orthogonal thereto. Further, "vertical" and "horizontal" as used herein are generally perpendicular directions relative one another and independent of orientation of the substrate in three-dimensional space.

The magnetic recording material of first electrode 25 comprises a first magnetic region 28, a second magnetic region 30 spaced from first magnetic region 28, and a third magnetic region 32 spaced from first magnetic region 28 and second magnetic region 30. Magnetic regions 28, 30, and 32 may comprise any suitable existing or yet-to-be-developed magnetic material(s). Examples include certain ones and combinations of Co, Fe, Ni, Pd, Pt, B, Ir, and Ru. More specific examples are one or a combination of Fe, CoFe, and CoFeB. In one embodiment, magnetic regions 28, 30, and 32 are of the same composition relative one another. In one embodiment, magnetic regions 28, 30, and 32 collectively comprise at least two different compositions relative one another. In one embodiment, magnetic regions 28, 30, and 32 have the same maximum and/or minimum thicknesses relative one another. In one embodiment, magnetic regions 28, 30, and 32 have at least two different maximum and/or minimum thicknesses relative one another. Example minimum thicknesses for each of magnetic regions 28, 30, and 32 are from about 8 Angstroms to about 25 Angstroms, with about 12 Angstroms to about 18 Angstroms being ideal.

A first non-magnetic insulator metal oxide-comprising region 29 is between first magnetic region 28 and second magnetic region 30. A second non-magnetic insulator metal oxide-comprising region 31 is between second magnetic region 30 and third magnetic region 32. Regions 29 and/or 31 may comprise, consist of, or consist essentially of non-magnetic insulator metal oxide. For clarity in the figures, non-magnetic insulator metal oxide-comprising regions are designated as "MO", where "M" is one or more elemental metals and "O" is of course oxygen, and regardless of stoichiometry or whether comprising one or more non-stoichiometric compositions. Example non-magnetic insulator metal oxides are magnesium oxide, calcium oxide, strontium oxide, yttrium oxide, titanium oxide, hafnium oxide, vanadium oxide, and aluminum oxide. In one embodiment, metal oxide-comprising regions 29 and 31 are of the same composition relative one another. In one embodiment, metal oxide-comprising regions 29 and 31 are of different compositions relative one another. In one embodiment, first metal oxide-comprising region 29 and second metal oxide-comprising region 31 have the same maximum and/or minimum thicknesses relative one another. In one embodiment, first metal oxide-comprising region 29 and second metal oxide-comprising region 31 have different maximum and/or minimum thicknesses relative one another. An example thickness is about 3 Angstroms to about 12 Angstroms, with about 4 Angstroms to about 6 Angstroms being an ideal example. In one embodiment, first metal oxide-comprising region 29 is directly against first magnetic region 28 and/or second magnetic region 30, for example as shown. In one embodiment, second metal oxide-comprising region 31 is directly against second magnetic region 30 and/or third magnetic region 32, for example as shown.

First electrode 25 may be considered as being on one electrode side of tunnel insulator material 22 (e.g., a top side as shown) and second electrode 27 may be considered as being on another electrode side of tunnel insulator material 22 (e.g., a bottom side as shown). In one embodiment, magnetic tunnel junction 15 comprises a non-magnetic insulator material 40 which is most-distal from tunnel insulator material 22 of all insulator materials (e.g., materials 29, 31, and 40) on the one electrode side of tunnel insulator material 22. In such example one embodiment, most-distal insulator material 40 is of the same composition as tunnel insulator material 22 and has lower maximum thickness than that of tunnel insulator material 22. Example thickness for non-magnetic insulator material 40 is the same as that described above for non-magnetic insulator metal oxide-comprising regions 29 and 31.

The magnetic reference material of second conductive magnetic electrode 27 may comprise any suitable existing or yet-to-be-developed magnetic reference material. As examples, such might comprise certain one or more of Co, Ni, Pt, Pd, and Ir, and for example may be in the form of a single homogenous ferromagnetic layer or as a synthetic antiferromagnetic composite employing one or more non-magnetic materials. As a more specific example, the magnetic reference material of second electrode 27 may comprise a suitable magnetic polarizer material (e.g., $Co_xFe_yB_z$, as identified above, at about 8 Angstroms to about 20 Angstroms) directly against tunnel insulator 22 and a synthetic antiferromagnet construction (e.g., about 20 Angstroms to 100 Angstroms of a Co/Pt/Co composite) further away from tunnel insulator 22 than the magnetic polarizer material.

Ideally the materials and regions of first electrode 25 and second electrode 27 are crystalline although may be amorphous or include amorphous material and regions. Characterization of a material or region as being "crystalline" where used in this document requires at least 90% by volume of the stated material or region to be crystalline. Characterization of a material or region as being "amorphous" where used in this document requires at least 90% by volume of the stated material to be amorphous.

Figure 2:
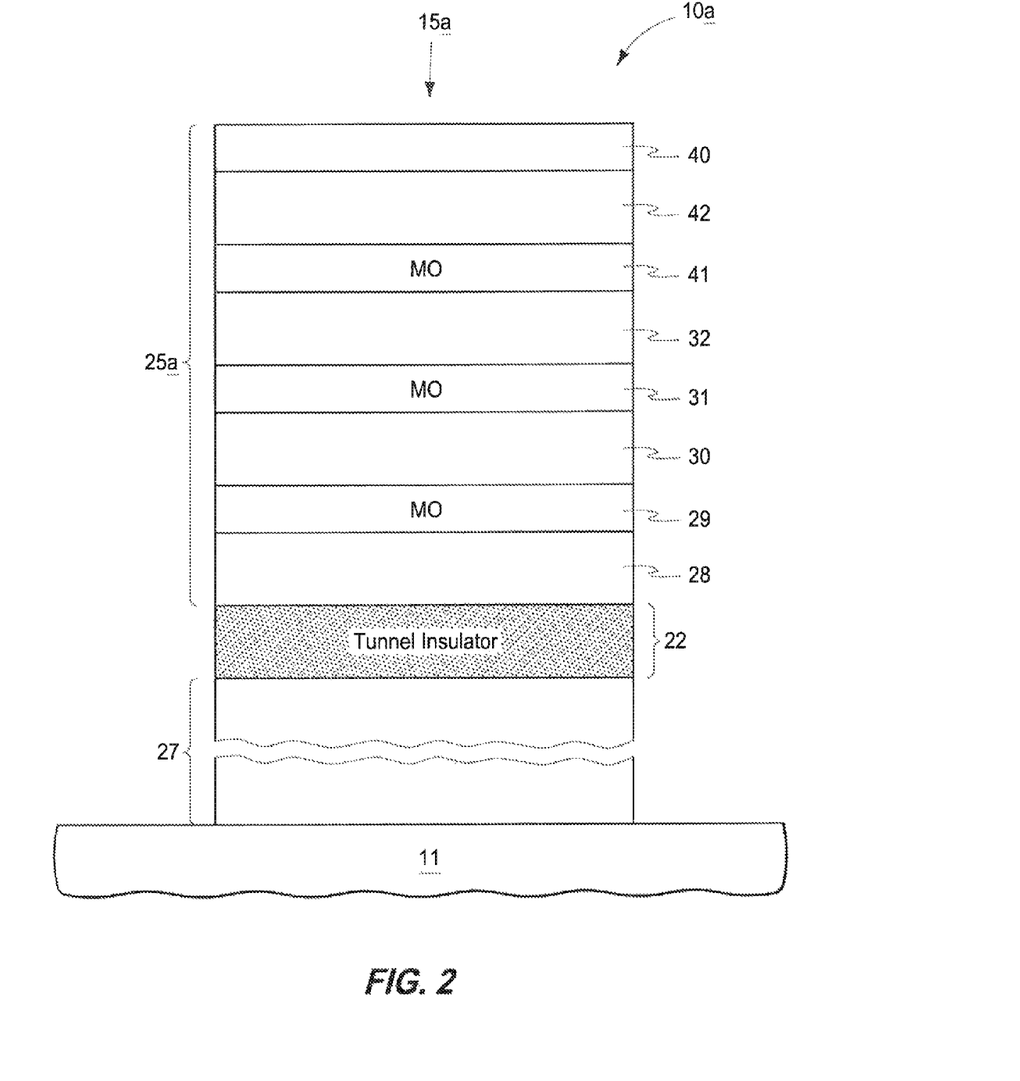
FIG. 2 is a diagrammatic sectional view of a substrate fragment comprising a magnetic tunnel junction in accordance with an embodiment of the invention.
Figure 3:
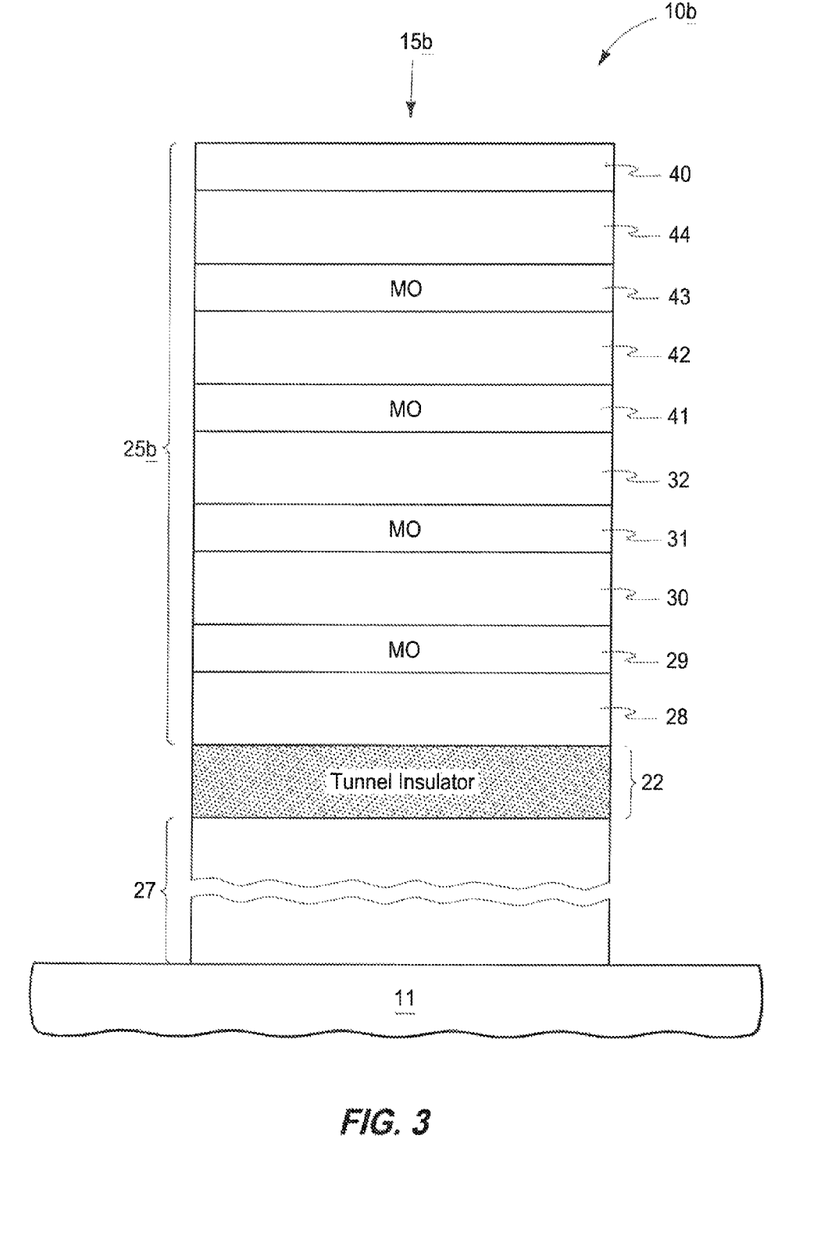
FIG. 3 is a diagrammatic sectional view of a substrate fragment comprising a magnetic tunnel junction in accordance with an embodiment of the invention.

In one embodiment, the magnetic recording material of the first electrode comprises at least one more magnetic region spaced from the third magnetic region, and at least one more non-magnetic insulator metal oxide-comprising region between the third magnetic region and the at least one more magnetic region. FIGS. 2 and 3 show example such embodiments with respect to magnetic tunnel junctions 15a and 15b with respect to substrates 10a and 10b, respectively. Like numerals from the above-described embodiments have been used where appropriate, with some construction differences being indicated with the suffixes "a" and "b", respectively, or with different numerals.

Referring to FIG. 2, the magnetic recording material of first electrode 25a comprises another magnetic region 42 spaced from third magnetic region 32, and another non-magnetic insulator metal oxide-comprising region 41 between third magnetic region 32 and the another magnetic region 42. Magnetic region 42 may have any of the attributes described above with respect to magnetic regions 28, 30, and 32. Non-magnetic insulator metal oxide-comprising region 41 may have any of the attributes described above with respect to metal oxide-comprising regions 29 and 31. Any other attribute(s) or aspect(s) as described above and/or shown in FIG. 1 may be used in the FIG. 2 embodiments.

Referring to FIG. 3, magnetic recording material of first electrode 25b has another magnetic region 44 and another non-magnetic insulator metal oxide-comprising region 43, each of which may have the same respective attributes as described above with respect to regions 42 and 41, respectively. Additional such magnetic regions and non-magnetic insulator metal oxide-comprising regions may be provided (not shown). Any other attribute(s) or aspect(s) as described above and/or shown in FIGS. 1 and 2 may be used in the FIG. 3 embodiments.

An embodiment of the invention comprises the magnetic recording material of the first electrode having multiple more magnetic regions (e.g., regions 42 and 44) spaced from the third magnetic region (e.g., region 32) and from one another (e.g., magnetic regions 42 and 44 being spaced from one another). Such embodiment also comprises multiple more non-magnetic insulator metal oxide-comprising regions (e.g., regions 41 and 43). One of the multiple more magnetic regions is most-proximate the third magnetic region (e.g., region 42) compared to all others of the multiple more magnetic regions (e.g., region 44). One of the multiple metal oxide-comprising regions is between the third magnetic region and the most-proximate magnetic region (e.g., region 41). All respective other of the metal oxide-comprising regions (e.g., region 43) are between immediately adjacent of the multiple more magnetic regions (e.g., region 43 being between immediately adjacent of the multiple more magnetic regions 42 and 44). More than the two additional magnetic regions 42 and 44, and non-magnetic insulator metal oxide-comprising regions 41 and 43, may be added as part of the first electrode.

Figure 5:
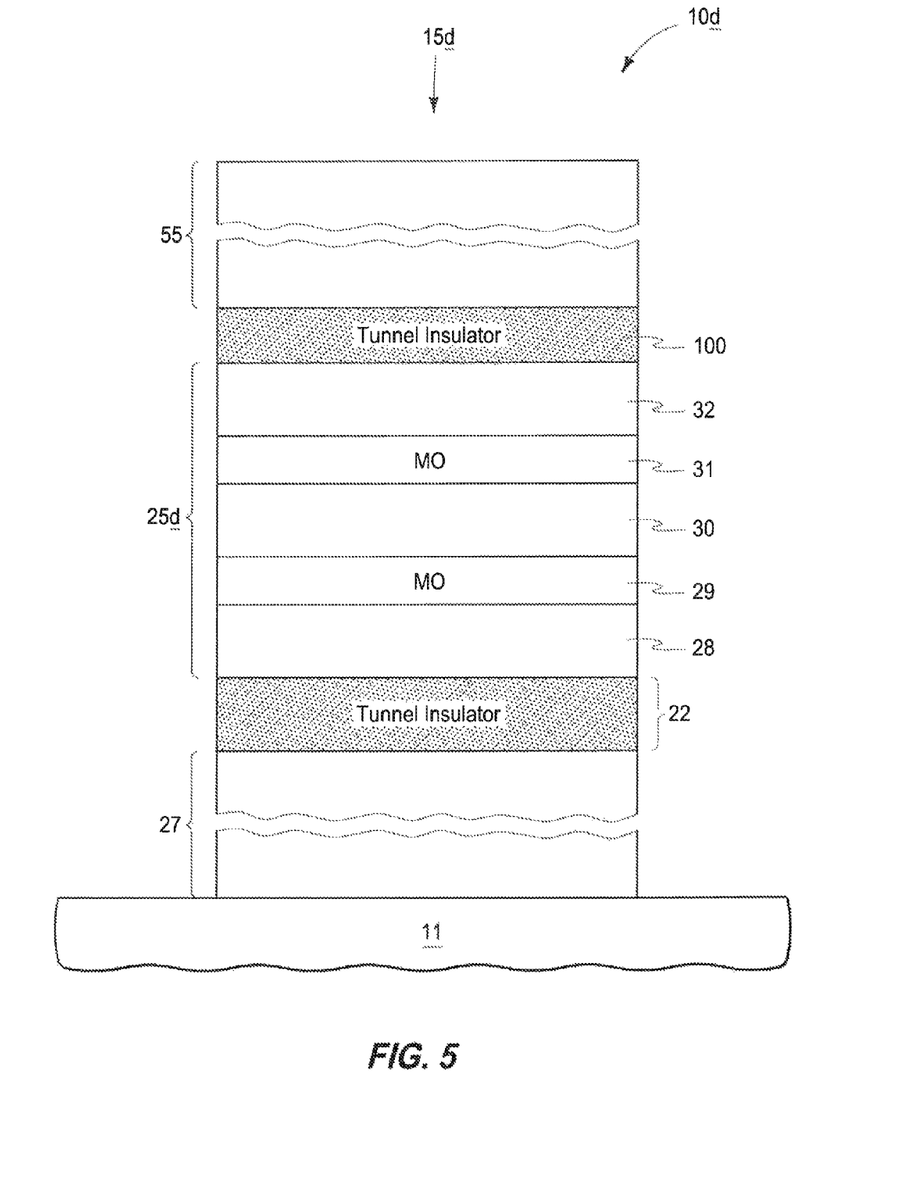
FIG. 5 is a diagrammatic sectional view of a substrate fragment comprising a magnetic tunnel junction in accordance with an embodiment of the invention.

The example embodiments of FIGS. 1-3 depict single magnetic tunnel junctions (SMTJs). However, dual magnetic tunnel junctions (DMTJs) or more than dual (two) magnetic tunnel junctions are contemplated. In one embodiment, a magnetic tunnel junction comprises another non-magnetic tunnel insulator material spaced from the second metal oxide-comprising insulator material over the third magnetic region of the magnetic recording material. In such example one embodiment, second magnetic reference material is over the another non-magnetic tunnel insulator material. The second magnetic reference material comprises magnetic polarizer material proximate the another non-magnetic tunnel insulator material. One such example embodiment is shown in FIG. 5, and is described in additional detail below.

Figure 4:
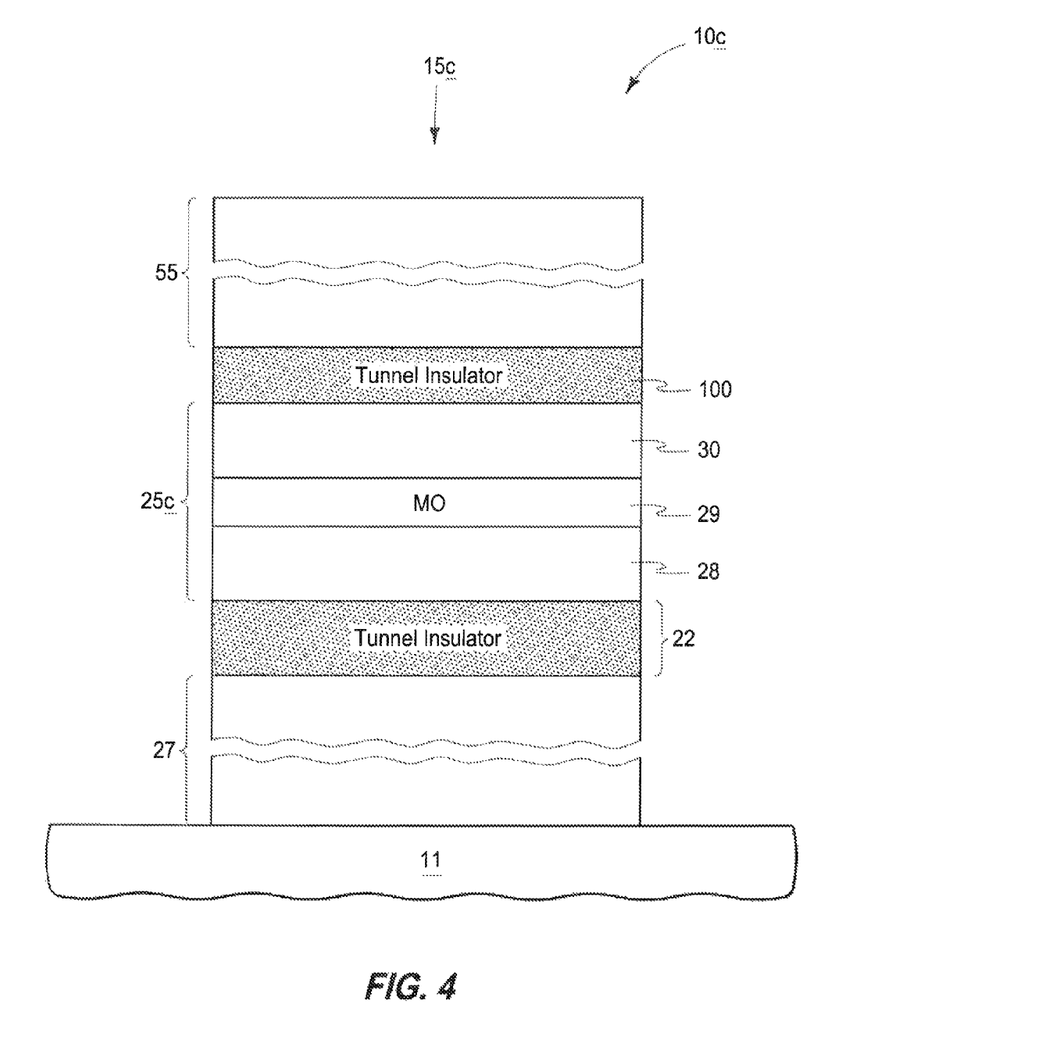
FIG. 4 is a diagrammatic sectional view of a substrate fragment comprising a magnetic tunnel junction in accordance with an embodiment of the invention.

An embodiment of the invention comprises a multiple-barrier magnetic tunnel junction (e.g., DMTJ), for example as shown in FIG. 4 with respect to a magnetic tunnel junction 15c as part of a substrate 10c. Like numerals from the above-described embodiments have been used where appropriate, with some construction differences being indicated with the suffix "c" or with different numerals. Material 22 comprises a first non-magnetic tunnel insulator material that is between first electrode 25c and second electrode 27. Magnetic recording material of first electrode 25c comprises first magnetic region 28 and second magnetic region 30 spaced from first magnetic region 28. Non-magnetic insulator metal oxide-comprising region 29 is between first magnetic region 28 and second magnetic region 30, with first magnetic region 28 being more proximate first non-magnetic tunnel insulator material 22 than second magnetic region 30. Second electrode 27 may be considered as comprising first magnetic reference material.

A second non-magnetic tunnel insulator material 100 is spaced from first non-magnetic tunnel insulator material 22 over second magnetic region 30 of the magnetic recording material of first electrode 25c. Second magnetic reference material 55 is over second non-magnetic tunnel insulator material 100, and comprises magnetic polarizer material proximate second non-magnetic tunnel insulator material 100. Second non-magnetic tunnel insulator material 100 may have any of the attributes described above with respect to tunnel insulator 22. Second magnetic reference material 55 may have any of the attributes described above with respect to the (first) magnetic reference material of second electrode 27. In one embodiment, first non-magnetic tunnel insulator material 22 and second non-magnetic tunnel insulator material 100 are of the same composition relative one another. In one embodiment, first non-magnetic tunnel insulator material 22 and second non-magnetic tunnel insulator material 100 are of different compositions relative one another. In one embodiment, the first and second non magnetic tunnel insulator materials have the same maximum and/or minimum thicknesses relative one another, and in one embodiment have different minimum and/or maximum thicknesses relative one another. In one ideal embodiment, second non-magnetic tunnel insulator material 100 has a lower minimum thickness than minimum thickness of first non-magnetic tunnel insulator material 22. An ideal thickness for second non-magnetic tunnel insulator material 100 is about 7 Angstroms to about 15 Angstroms. In one embodiment, second non-magnetic tunnel insulator material 100 is directly against magnetic region 30. Any other attribute(s) or aspect(s) as described above and/or shown in FIGS. 1-3 may be used in the FIG. 4 embodiments.

Figure 6:
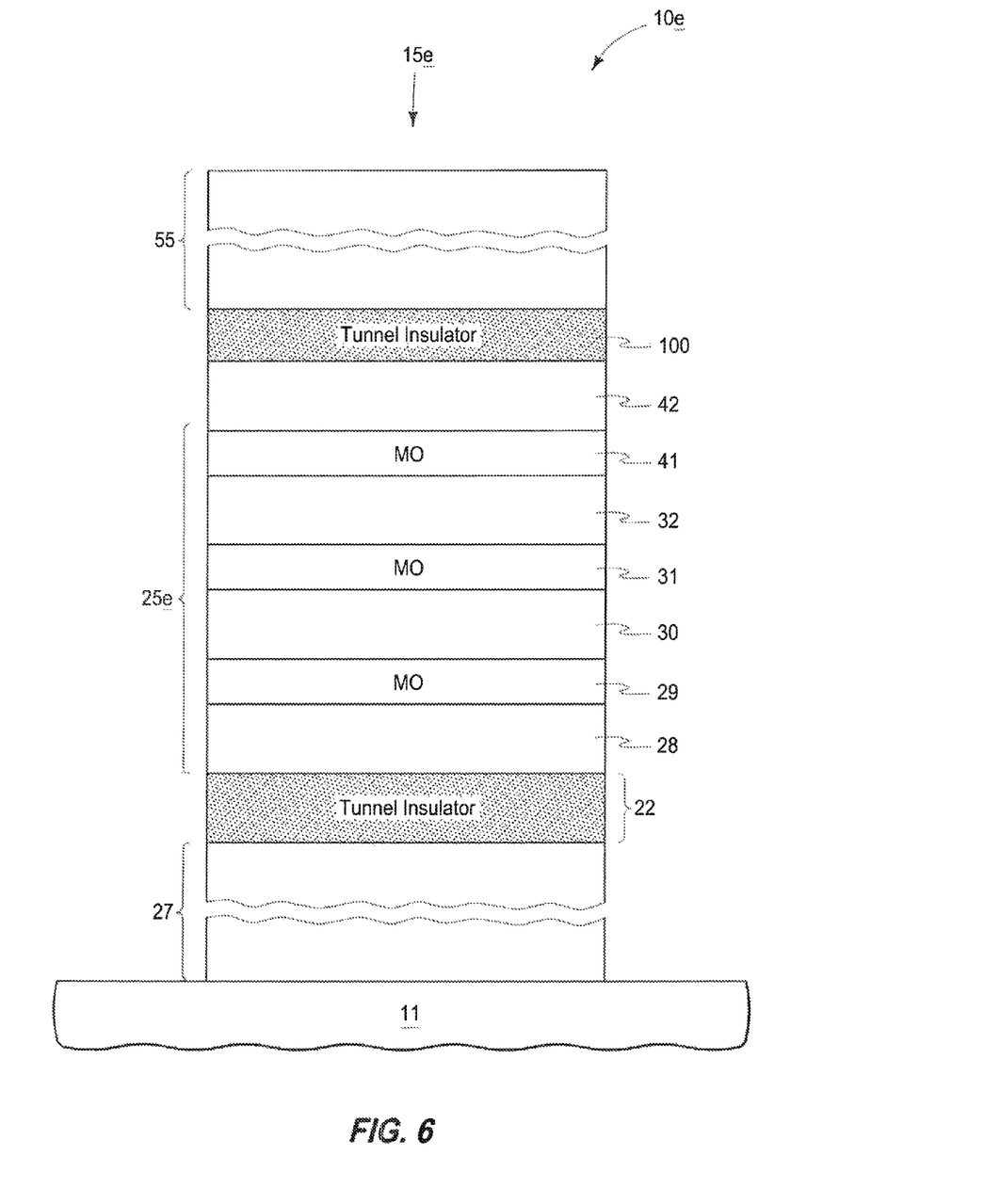
FIG. 6 is a diagrammatic sectional view of a substrate fragment comprising a magnetic tunnel junction in accordance with an embodiment of the invention.

In one embodiment, the magnetic recording material of the first electrode comprises at least one more magnetic region spaced from the second magnetic region, and at least one more non-magnetic insulator metal oxide-comprising region between the second magnetic region and the at least one more magnetic region. FIGS. 5 and 6 show example such embodiments with respect to magnetic tunnel junctions 15d and 15e with respect to substrates 10d and 10e, respectively. Like numerals from the above-described embodiments have been used where appropriate, with some construction differences being indicated with the suffixes "d" and "e", respectively, or with different numerals.

Referring to FIG. 5, the magnetic recording material of first electrode 25d comprises another magnetic region 32 spaced from second magnetic region 30, and another non-magnetic insulator metal oxide-comprising region 31 between second magnetic region 30 and the another magnetic region 32. Any other attribute(s) or aspect(s) as described above and/or shown in FIGS. 1-4 may be used in the FIG. 5 embodiment.

Referring to FIG. 6, magnetic recording material of first electrode 25e has another magnetic region 42 and another non-magnetic insulator metal oxide-comprising region 41. Additional such magnetic regions and non-magnetic insulator metal oxide-comprising regions may be provided (not shown). Any other attribute(s) or aspect(s) as described above and/or shown in FIGS. 1-5 may be used in the FIG. 6 embodiments.

FIGS. 4-6 illustrate example DMTJ embodiments, although more than dual (two) tunnel barrier material-functioning layers may be used.

An embodiment of the invention comprises a magnetic tunnel junction (e.g., 15, 15a, 15b, 15c, 15d, 15e) that comprises a conductive first magnetic electrode (e.g., 25, 25a, 25b, 25c, 25d, 25e) comprising magnetic recording material. A conductive second magnetic electrode (e.g., electrode 27) is spaced from the first electrode and comprises magnetic reference material. A non-magnetic tunnel insulator material (e.g., material 22) is between the first and second electrodes. The non-magnetic tunnel insulator material comprises metal oxide (i.e., as described above). In one ideal embodiment, the non-magnetic tunnel insulator material comprises, consists essentially of, or consists of MgO. The magnetic recording material of the first electrode comprises a first magnetic region and a second magnetic region spaced from the first magnetic region (e.g., regions 28 and 30, respectively). The first magnetic region is more proximate the non-magnetic tunnel insulator material than the second magnetic region. The first electrode comprises a first non-magnetic insulator metal oxide-comprising region (e.g., region 29) between the first and second magnetic regions. A second non-magnetic insulator metal oxide-comprising region is spaced from the first non-magnetic tunnel insulator material over the second magnetic region of the magnetic recording material. For example in the embodiments of FIGS. 1-3, any of regions 31, 41, and 43 are example such second non-magnetic insulator metal oxide-comprising regions. In the embodiments of FIGS. 4-6, any of regions 100, 31, and 41 are example such second non-magnetic insulator metal oxide-comprising regions.

In one embodiment, the magnetic tunnel junction is SMTJ (e.g., any of FIGS. 1, 2, and 3), and in one embodiment is DMTJ (e.g., any of FIGS. 4, 5, 6).

In one embodiment, the non-magnetic tunnel insulator material, the first non-magnetic insulator metal oxide-comprising region, and the second non-magnetic insulator metal oxide-comprising region are of the same composition relative one another. In one embodiment, the non-magnetic tunnel insulator material, the first non-magnetic insulator metal oxide-comprising region, and the second non-magnetic insulator metal oxide-comprising region collectively comprise at least two different compositions relative one another.

Any other attribute(s) or aspect(s) as described above may be used.

As a specific example for magnetic tunnel junction 15, second electrode 27 includes 50 Angstroms of Ru directly against substrate 11, 24 Angstroms of a CoPt superlattice-like multilayer directly against the Ru, 4 Angstroms of Ru directly against the CoPt superlattice-like multilayer, 12 Angstroms of a CoPt superlattice-like multilayer directly against the Ru, 4 Angstroms of Co directly against the Ru, 2 Angstroms of Ta directly against the Co, and 8 Angstroms of $Co_xFe_yB_z$ directly against the Ta, with the $Co_xFe_yB_z$ functioning primarily as magnetic polarizer material. Tunnel insulator 22 is 15 Angstroms of MgO. Magnetic region 28 includes 8 Angstroms of $Co_{20}Fe_{50}B_{30}$ (molar quantities as initially deposited, not necessarily in final construction) directly against tunnel insulator 22. Such further includes 10 Angstroms of $Co_{20}Fe_{60}B_{20}$ (molar quantities as initially deposited, not necessarily in final construction) directly against the $Co_{20}Fe_{50}B_{30}$, and which is of variable thickness. Region 29 is 6 Angstroms of MgO directly against the $Co_{20}Fe_{60}B_{20}$ of first magnetic region 28. Second magnetic region 30 is 9 Angstroms of Fe directly against region 29 and 3 Angstroms of $Co_{20}Fe_{60}B_{20}$ (molar quantities as initially deposited, not necessarily in final construction) directly against the Fe. Region 31 is 6 Angstroms of MgO directly against second magnetic region 30. Third magnetic region 32 is a repeat of second magnetic region 30. Material 40 is 5 Angstroms of MgO directly against third magnetic region 32.

A specific example FIG. 2 construction is the same as described immediately-above for FIG. 1 moving upward from substrate 11 through region 29. Region 30 is 10 Angstroms of Fe directly against region 29, and 3 Angstroms of $Co_{20}Fe_{60}B_{20}$ directly against the Fe. Region 30 is 6 Angstroms of MgO. Region 32 is a repeat of region 30. Region 41 is a repeat of region 31. Region 42 is a repeat of region 30, and material 40 is the same as in FIG. 1.

The immediately above examples can be extrapolated to the example FIGS. 3-6 embodiments.

One key performance metric of a magnetic tunnel junction is the ratio $E_b/I_c$, where $E_b$ is the energy barrier of the magnetic recording material in ergs and $I_c$ is the critical switching current in amperes. Providing multiple MO layers within the magnetic recording material may increase the number of perpendicular magnetic anisotropy generating interfaces which allows for increased $E_b$ while maintaining similar or only slightly higher $I_c$, thus improving the $E_b/I_c$ ratio.

CONCLUSION

In some embodiments, a magnetic tunnel junction comprises a conductive first magnetic electrode comprising magnetic recording material. A conductive second magnetic electrode is spaced from the first electrode and comprises magnetic reference material. A non-magnetic tunnel insulator material is between the first and second electrodes. The magnetic recording material of the first electrode comprises a first magnetic region, a second magnetic region spaced from the first magnetic region, and a third magnetic region spaced from the first and second magnetic regions. A first non-magnetic insulator metal oxide-comprising region is between the first and second magnetic regions. A second non-magnetic insulator metal oxide-comprising region is between the second and third magnetic regions.

In some embodiments, a magnetic tunnel junction comprises a conductive first magnetic electrode comprising magnetic recording material. A conductive second magnetic electrode is spaced from the first electrode and comprises first magnetic reference material. A first non-magnetic tunnel insulator material is between the first and second electrodes. The magnetic recording material of the first electrode comprises a first magnetic region and a second magnetic region spaced from the first magnetic region. A non-magnetic insulator metal oxide-comprising region is between the first and second magnetic regions. The first magnetic region is more proximate the first non-magnetic tunnel insulator material than the second magnetic region. A second non-magnetic tunnel insulator material is spaced from the first non-magnetic tunnel insulator material over the second magnetic region of the magnetic recording material. Second magnetic reference material is over the second non-magnetic tunnel insulator material. The second magnetic reference material comprises magnetic polarizer material proximate the second non-magnetic tunnel insulator material.

In some embodiments, a magnetic tunnel junction comprises a conductive first magnetic electrode comprising magnetic recording material. A conductive second magnetic electrode is spaced from the first electrode and comprises magnetic reference material. A non-magnetic tunnel insulator material comprising metal oxide is between the first and second electrodes. The magnetic recording material of the first electrode comprises a first magnetic region and a second magnetic region spaced from the first magnetic region. The first magnetic region is more proximate the non-magnetic tunnel insulator material than the second magnetic region. The first electrode comprises a first non-magnetic insulator metal oxide-comprising region between the first and second magnetic regions. A second non-magnetic insulator metal oxide-comprising region is spaced from the first non-magnetic tunnel insulator region over the second magnetic region of the magnetic recording material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A magnetic tunnel junction comprising:
   a conductive first magnetic electrode comprising magnetic recording material;
   a conductive second magnetic electrode spaced from the first electrode and comprising magnetic reference material;
   a non-magnetic tunnel insulator material between the first and second electrodes; and
   the magnetic recording material of the first electrode comprising a first magnetic region, a second magnetic region spaced from the first magnetic region, and a third magnetic region spaced from the first and second magnetic regions; a first non-magnetic insulator metal oxide-comprising region between the first and second magnetic regions; and a second non-magnetic insulator metal oxide-comprising region between the second and third magnetic regions, the magnetic recording material of the first electrode comprising at least one more magnetic region spaced from the third magnetic region, and comprising at least one more non-magnetic insulator metal oxide-comprising region between the third magnetic region and the at least one more magnetic region.

2. The magnetic tunnel junction of claim 1 wherein the first and second metal oxide-comprising regions are of the same composition relative one another.

3. The magnetic tunnel junction of claim 1 wherein the first and second metal oxide-comprising regions are of different compositions relative one another.

4. The magnetic tunnel junction of claim 1 wherein the first and second metal oxide-comprising regions have the same minimum thickness relative one another.

5. The magnetic tunnel junction of claim 1 wherein the first and second metal oxide-comprising regions have different minimum thicknesses relative one another.

6. The magnetic tunnel junction of claim 1 wherein the first and second metal oxide-comprising regions are of the same composition relative one another and have the same minimum thickness relative one another.

7. The magnetic tunnel junction of claim 1 wherein the first metal oxide-comprising region is directly against the first and second magnetic regions.

8. The magnetic tunnel junction of claim 1 wherein the second metal oxide-comprising region is directly against the second and third magnetic regions.

9. A magnetic tunnel junction comprising:
   a conductive first magnetic electrode comprising magnetic recording material;
   a conductive second magnetic electrode spaced from the first electrode and comprising magnetic reference material;
   a non-magnetic tunnel insulator material between the first and second electrodes; and
   the magnetic recording material of the first electrode comprising a first magnetic region, a second magnetic region spaced from the first magnetic region, and a third magnetic region spaced from the first and second magnetic regions; a first non-magnetic insulator metal oxide-comprising region between the first and second magnetic regions; and a second non-magnetic insulator metal oxide-comprising region between the second and third magnetic regions, the magnetic recording material of the first electrode comprising multiple more magnetic regions spaced from the third magnetic region and one another, and comprising multiple more non-magnetic insulator metal oxide-comprising regions; one of the multiple more magnetic regions being most-proximate the third magnetic region compared to all others of the multiple more magnetic regions, one of the multiple more metal oxide-comprising regions being between the third magnetic region and said most-proximate magnetic region, all respective other of the multiple metal oxide-comprising regions being between immediately adjacent of the multiple more magnetic regions.

10. The magnetic tunnel junction of claim 1 being SMTJ.

11. The magnetic tunnel junction of claim 1 comprising:
another non-magnetic tunnel insulator material spaced from the second metal oxide-comprising region over the third magnetic region of the magnetic recording material; and
second magnetic reference material over the another non-magnetic tunnel insulator material, the second magnetic reference material comprising magnetic polarizer material proximate the another non-magnetic tunnel insulator material.

12. The magnetic tunnel junction of claim 1 wherein the first electrode is on one electrode side of the tunnel insulator material, and comprising a non-magnetic insulator material most-distal from the tunnel insulator material of all insulator materials of the magnetic tunnel junction on the one electrode side, the most-distal insulator material being of the same composition as the tunnel insulator material and having a lower maximum thickness than that of the tunnel insulator material.

13. A multiple-barrier magnetic tunnel junction comprising:
a conductive first magnetic electrode comprising magnetic recording material;
a conductive second magnetic electrode spaced from the first electrode and comprising first magnetic reference material;
a first non-magnetic tunnel insulator material between the first and second electrodes;
the magnetic recording material of the first electrode comprising a first magnetic region and a second magnetic region spaced from the first magnetic region, a non-magnetic insulator metal oxide-comprising region between the first and second magnetic regions, the first magnetic region being more proximate the first non-magnetic tunnel insulator material than the second magnetic region;
a second non-magnetic tunnel insulator material spaced from the first non-magnetic tunnel insulator material over the second magnetic region of the magnetic recording material; and
second magnetic reference material over the second non-magnetic tunnel insulator material, the second magnetic reference material comprising magnetic polarizer material proximate the second non-magnetic tunnel insulator material.

14. The magnetic tunnel junction of claim 13 wherein the first and second non-magnetic tunnel insulator materials are of the same composition relative one another.

15. The magnetic tunnel junction of claim 13 wherein the first and second non-magnetic tunnel insulator materials are of different compositions relative one another.

16. The magnetic tunnel junction of claim 13 wherein the first and second non-magnetic tunnel insulator materials have the same minimum thickness relative one another.

17. The magnetic tunnel junction of claim 13 wherein the second first and second non-magnetic tunnel insulator materials have different minimum thicknesses relative one another.

18. The magnetic tunnel junction of claim 13 wherein the second non-magnetic tunnel insulator material has a lower minimum thickness than minimum thickness of the first non-magnetic tunnel insulator material.

19. The magnetic tunnel junction of claim 13 wherein the metal oxide-comprising region is directly against the first and second magnetic regions.

20. The magnetic tunnel junction of claim 13 wherein the magnetic recording material of the first electrode comprises at least one more magnetic region spaced from the second magnetic region, and comprising at least one more non-magnetic insulator metal oxide-comprising region between the second magnetic region and the at least one more magnetic region.

21. The magnetic tunnel junction of claim 13 wherein the magnetic recording material of the first electrode comprises multiple more magnetic regions spaced from the second magnetic region and one another, and comprising multiple more non-magnetic insulator metal oxide-comprising regions; one of the multiple more magnetic regions being most-proximate the second magnetic region compared to all others of the multiple more magnetic regions, one of the multiple more metal oxide-comprising regions being between the second magnetic region and said most-proximate magnetic region, all respective other of the multiple metal oxide-comprising regions being between immediately adjacent of the multiple more magnetic regions.

22. The magnetic tunnel junction of claim 13 wherein the first electrode is on one electrode side of the tunnel insulator material, and comprising a non-magnetic insulator material most-distal from the tunnel insulator material of all insulator materials of the magnetic tunnel junction on the one electrode side, the most-distal insulator material being of the same composition as the tunnel insulator material and having a lower maximum thickness than that of the tunnel insulator material.

23. A magnetic tunnel junction comprising:
a conductive first magnetic electrode comprising magnetic recording material;
a conductive second magnetic electrode spaced from the first electrode and comprising magnetic reference material;
a non-magnetic tunnel insulator material comprising metal oxide between the first and second electrodes;
the magnetic recording material of the first electrode comprising a first magnetic region and a second magnetic region spaced from the first magnetic region, the first magnetic region being more proximate the non-magnetic tunnel insulator material than the second magnetic region;
the first electrode comprising a first non-magnetic insulator metal oxide-comprising region between the first and second magnetic regions; and
a second non-magnetic insulator metal oxide-comprising region spaced from the first non-magnetic tunnel insulator region over the second magnetic region of the magnetic recording material.

24. The magnetic tunnel junction of claim 23 being SMTJ.

25. The magnetic tunnel junction of claim 23 being DMTJ.

26. The magnetic tunnel junction of claim 23 wherein the non-magnetic tunnel insulator material, the first non-magnetic insulator metal oxide-comprising region, and the second non-magnetic insulator metal oxide-comprising region are of the same composition relative one another.

27. The magnetic tunnel junction of claim 23 wherein the non-magnetic tunnel insulator material, the first non-magnetic insulator metal oxide-comprising region, and the second non-magnetic insulator metal oxide-comprising region collectively comprise at least two different compositions relative one another.

28. The magnetic tunnel junction of claim 27 wherein the non-magnetic tunnel insulator material, the first non-magnetic insulator metal oxide-comprising region, and the second non-magnetic insulator metal oxide-comprising region collectively comprise three different compositions relative one another.

29. The magnetic tunnel junction of claim 23 wherein the first electrode is on one electrode side of the tunnel insulator material, and comprising a non-magnetic insulator material most-distal from the tunnel insulator material of all insulator materials of the magnetic tunnel junction on the one electrode side, the most-distal insulator material being of the same composition as the tunnel insulator material and having a lower maximum thickness than that of the tunnel insulator material.

* * * * *